(12) United States Patent
Stevens (10) Patent No.: US 10,388,688 B2
(45) Date of Patent: Aug. 20, 2019

(54) METHOD OF FORMING A SHALLOW PINNED PHOTODIODE

(71) Applicant: SEMICONDUCTOR COMPONENTS INDUSTRIES, LLC, Phoenix, AZ (US)

(72) Inventor: Eric G. Stevens, Webster, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 240 days.

(21) Appl. No.: 15/595,356

(22) Filed: May 15, 2017

(65) Prior Publication Data
US 2017/0250217 A1    Aug. 31, 2017

Related U.S. Application Data

(62) Division of application No. 14/675,363, filed on Mar. 31, 2015, now Pat. No. 9,685,479.

(51) Int. Cl.
| | | |
|---|---|---|
| *H01L 21/00* | (2006.01) | |
| *H01L 27/146* | (2006.01) | |
| *H01L 27/148* | (2006.01) | |
| *H01L 27/00* | (2006.01) | |
| *H01L 21/225* | (2006.01) | |

(52) U.S. Cl.
CPC .... *H01L 27/14643* (2013.01); *H01L 27/1461* (2013.01); *H01L 27/14603* (2013.01);
(Continued)

(58) Field of Classification Search
CPC ........... H01L 21/2255; H01L 21/76254; H01L 21/308; H01L 21/76843; H01L 21/31144;
(Continued)

(56) References Cited

U.S. PATENT DOCUMENTS

| 3,607,449 A | 9/1971 | Tokuyama et al. |
| 4,717,945 A | 1/1988 | Yusa et al. |

(Continued)

OTHER PUBLICATIONS

Teranishi et al., "No image lag photodiode structure in the interline CCD image sensor," Technical Digest of the IEEE Electron Device Meeting, Dec. 1982, pp. 324-327.

(Continued)

*Primary Examiner* — Nikolay K Yushin
(74) *Attorney, Agent, or Firm* — Treyz Law Group, P.C.; Joseph F. Guihan (57) ABSTRACT

An image sensor with a pinned photodiode includes a photodiode formed in a substrate by implanting dopants of a first type through one or more dielectric layers formed over the substrate. A pinning layer for the photodiode may be formed by implanting dopants of a second type through the same one or more dielectric layers. The pinning layer may be formed over a photodiode region of the substrate. The concentration of dopants of the second type may have a maximum value in dielectric layers over the photodiode that exceeds the concentration of dopants of the second type in the substrate below. The photodiode and pinning layer may both be formed by implanting ions of the first and second type respectively through a dielectric layer formed after etching away a portion of another dielectric layer, having a different thickness, and having different optical transmission properties than the another dielectric layer.

10 Claims, 7 Drawing Sheets

(52) U.S. Cl.
CPC .. *H01L 27/14616* (2013.01); *H01L 27/14689* (2013.01); *H01L 27/14806* (2013.01); *H01L 27/14812* (2013.01); *H01L 27/14831* (2013.01); *H01L 21/2255* (2013.01)

(58) Field of Classification Search
CPC ......... H01L 27/14689; H01L 27/14643; H01L 27/14603; H01L 27/1461; H01L 27/14812; H01L 27/14831; H01L 27/14806; H01L 27/14616
See application file for complete search history.

(56) References Cited

U.S. PATENT DOCUMENTS

| | | | |
|---|---|---|---|
| 4,758,525 A | 7/1988 | Kida et al. | |
| 5,424,222 A | 6/1995 | Arndt | |
| 5,567,632 A | 10/1996 | Nakashiba et al. | |
| 5,904,493 A | 5/1999 | Lee et al. | |
| 6,306,676 B1 | 10/2001 | Stevens et al. | |
| 7,122,408 B2 | 10/2006 | Mouli et al. | |
| 7,378,691 B2 * | 5/2008 | Geshi | H01L 27/14806 257/223 |
| 7,521,738 B2 | 4/2009 | Rhodes | |
| 7,888,215 B2 | 2/2011 | Mao et al. | |
| 7,989,252 B2 | 8/2011 | Yang et al. | |
| 2007/0069260 A1 | 3/2007 | Stevens | |

OTHER PUBLICATIONS

Guidash et al., "A 0.6μm CMOS Pinned Photodiode Color Imager Technology," Technical Digest of the IEEE Electron Device Meeting, Dec. 1997, pp. 927-929.

* cited by examiner

METHOD OF FORMING A SHALLOW PINNED PHOTODIODE

This application is a division of patent application Ser. No. 14/675,363, filed Mar. 31, 2015, which is hereby incorporated by reference herein in its entirety. This application claims the benefit of and claims priority to patent application Ser. No. 14/675,363, filed Mar. 31, 2015.

BACKGROUND

This relates to image sensors, and more particularly, to photodiodes used in an image pixel array of an image sensor and the methods of forming the photodiodes.

Electronic devices such as cellular telephones, cameras, and computers often include imaging systems that include digital image sensors for capturing images. Image sensors may be formed having a two-dimensional array of image pixels containing photodiodes that convert incident photons (light) into electrical signals. Electron-hole pairs may be generated when photons with a sufficient energy are incident on a photodiode region of a pixel.

In pixels of a charge-coupled device (CCD) or CMOS based image sensors, it may be necessary to apply large voltages to a transfer gate that is adjacent to the photodiode region of a pixel to enable a total transfer of charges from the photodiode to the adjacent charge-coupled device or floating diffusion region. Conventional CCD and CMOS image sensors include pixels having a shallow, or thin pinning layer with a peak dopant concentration below an oxide layer that is typically formed over the photodiode region of the pixel.

Forming a thin pinning layer enables reduced smear in image sensors. Because fewer carriers are generated in a thin pinning layer compared to a thicker pinning layer, the risk of lateral charge carrier spread (or carrier diffusion) within the neutral region of the pinning layer to other regions of the pixel where these excess charge carriers (such as electrons in devices using n-type photodiodes) can be interpreted as image signals is reduced, thereby reducing smear. Forming a thin pinning layer can also reduce the depth of an associated photodiode implant required to store a given amount of charge as required by the dynamic range constraints of the imager which uses the photodiode, which reduces the so-called empty diode potential, or pinned potential. Reducing the empty-diode potential reduces the voltage required on the transfer gate to enable a complete readout of charge collected in photodiode into the adjacent CCD or floating diffusion region. For a typical CCD device built with a lateral-overflow drain, (e.g. U.S. Pat. No. 4,717,945), the reduced empty-diode potential also reduces the so-called, electronic shutter voltage, which is the voltage applied to the substrate as required to completely empty the photodiodes.

Current approaches to forming pinning layers involve implanting ion impurities predominantly in a region of the semiconductor substrate above the photodiode layer. Conventional pinning layers associated with a photodiode have a peak impurity ion dopant concentration in the semiconductor substrate in which the photodiode is formed.

In conventional manufacturing, pinning layers are implanted into a semiconductor (e.g., silicon) substrate into bare silicon, or through a dielectric overlayer that is formed over the substrate. Some conventional pinning layers in image pixels are implanted through a dielectric layer of a greater thickness as the dielectric layer formed above a CCD's buried channel implant or floating diffusion implant used to read out the photodiode charge. Conventional methods to form pinning layers also involve forming a gate electrode before implanting a photodiode region in the semiconductor substrate.

Conventional practice in forming the pinning layer for a photodiode aims to ensure that the implant of impurity dopants associated with the pinning layer goes through any dielectric overlayers that are formed over the photodiode and has a peak concentration in the silicon substrate to avoid variability in the device characteristics caused by any thickness variation in the overlayers. Because the tail of the impurity dopant implant profile falls off quickly, conventional practice aims to avoid implanting impurity dopants in the dielectric overlayers, because small changes in thickness of the over-layers can result in significant change in the amount of dopant that gets into the silicon, the conventional location for the pinning layer.

It would be therefore be desirable to provide improved methods for implanting shallow pinning layers for photodiodes used in image pixel arrays.

DETAILED DESCRIPTION

Figure 1:
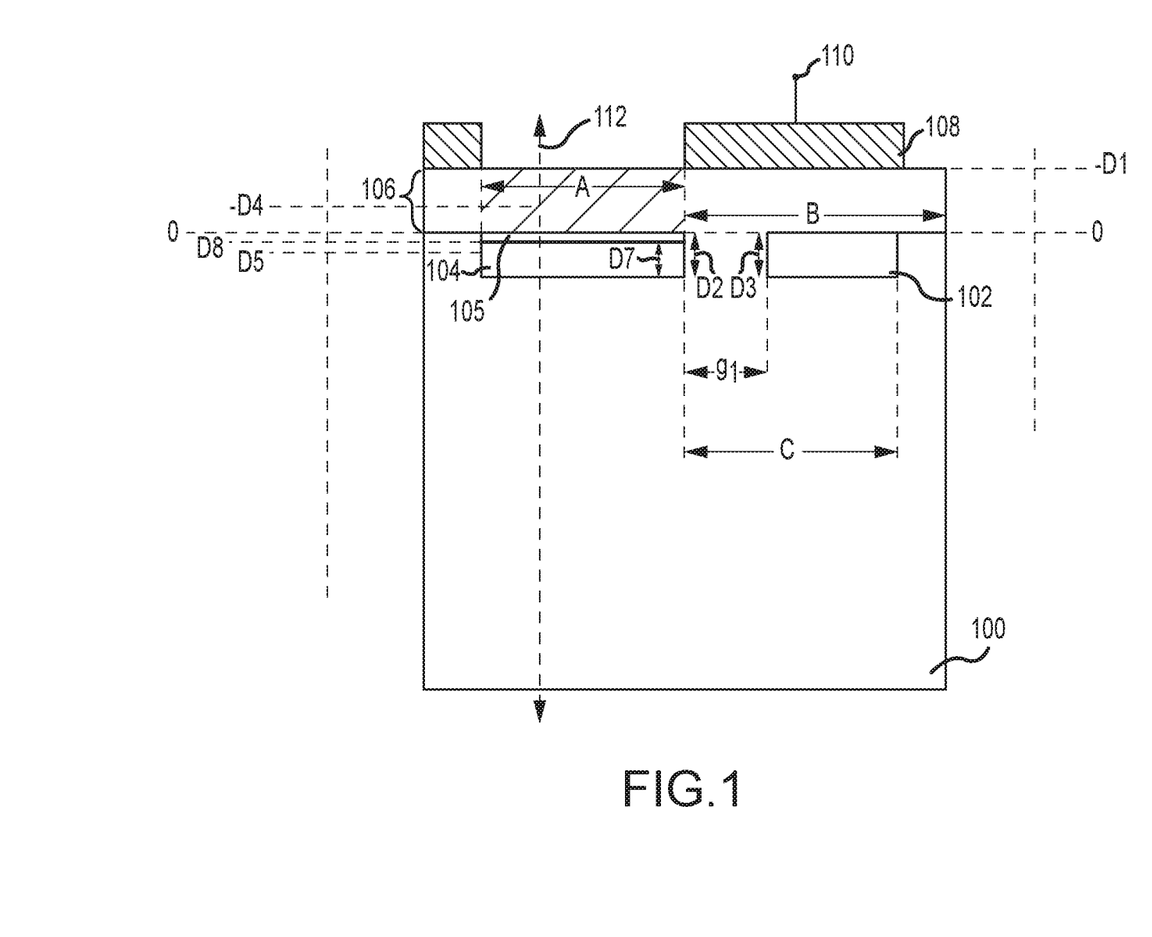
FIG. 1 is a cross-sectional view of an illustrative image sensor having a pinning layer formed over a photodiode in accordance with an embodiment.

FIG. 1 is a cross-sectional view of an image sensor including a photodiode and a pinning layer formed in accordance with an embodiment. The dopant types mentioned in connection with FIG. 1 are merely illustrative. In an embodiment, n-type dopants may be used where p-type dopants are mentioned, and p-type dopants may be used where n-type dopants are mentioned. To avoid obfuscation of the present invention, a convention wherein photodiode regions are formed from n– type regions of a semiconductor may be used. However, it will be appreciated by one of ordinary skill that photodiode regions may be formed from p-type regions of a semiconductor without departing from the scope of the present invention, and may involve reversing the dopant impurity types mentioned in connection with other regions of the embodiments. Additionally, the invention is described as it would be incorporated in a typical interline CCD image sensor wherein region 102 of FIG. 1 is the CCD's buried-channel region. However, it will be appreciated by one of ordinary skill in the art that the invention of creating the pinned photodiode in this manner could also be applied to a CMOS image sensor.

Substrate 100 may be a semiconductor substrate in which a photodiode region 104 is formed. Photodiode region 104 may be formed by implanting n-type impurity dopants into the semiconductor substrate 100. Buried channel implant region 102 may be formed by implanting n-type impurity dopants into the semiconductor substrate. Buried channel implant region 102 may be interchangeably referred to as charge-coupled device (CCD) region 102. The concentration of n-type impurity dopants in photodiode region 104 may be greater than the concentration of n-type impurity dopants in buried channel implant region 102. Buried channel implant region 102 may be an n− region, whereas photodiode region 104 may be an n+ region. Alternatively, photodiode region 104 may have the same or a lower n-type impurity dopant concentration than buried channel implant region 102. As described above, in certain embodiments, the image sensor of FIG. 1 may be a CMOS image sensor. Region 102 in substrate 100 may be a floating diffusion region 102 in a CMOS image sensor.

A dielectric overlayer 106 may be formed over an upper surface of substrate 100. Dielectric overlayer 106 may be an oxide layer. Dielectric overlayer 106 may be an oxide layer over which a nitride layer is formed, or a nitride layer over which an oxide layer is formed. Dielectric overlayer 106 may be an oxide-nitride-oxide (ONO) layer which includes a nitride layer formed on an oxide layer, and another oxide layer is formed on the nitride layer. Generally dielectric overlayer may be any dielectric layer, or any multiple dielectric layers. Dielectric overlayer 106 may have a thickness D1. Region A of dielectric overlayer 106 may refer to the region of dielectric overlayer 106 that is above the area of photodiode region 104. Region B of dielectric overlayer 106 may refer to the region of dielectric overlayer 106 that is adjacent to region A of dielectric overlayer 106.

Region B of dielectric overlayer 106 may be above the area of buried channel implant region 102, and the gap of distance g1 that separates buried channel implant region 102 and photodiode region 104. The portion of substrate 100 that is between photodiode region 104 and buried channel implant 102 may be referred to as a transfer gate region for the photodiode. Charge generated and collected in photodiode region 104 may be transferred to (or, read out to) buried channel implant region 102 by passing through the transfer gate region of the semiconductor substrate.

Dielectric overlayer 106 may have a different dielectric thickness, or a different dielectric composition in region A, compared with the rest of the dielectric overlayer such as region B. Alternatively, dielectric overlayer 106 may have a uniform thickness and composition in regions A and B, and be substantially the same dielectric overlayer 106 in the two regions A and B. A pinning layer 105 may be formed within the substrate under (or, directly under) region A of dielectric overlayer 106. The pinning layer 105 formed within the substrate under region A may be formed by implanting p-type dopants into and through the dielectric overlayer. The doping profile of the p-type dopants implanted into pinning layer 105 within the substrate under region A of dielectric overlayer 106 may be characterized by having a peak dopant concentration within region A of dielectric overlayer 106. The pinning layer may be formed by implanting Boron or $BF_{2-}$ atoms, for example, into the substrate under region A of dielectric overlayer 106. The energy at which p-type dopants are implanted into region A of dielectric overlayer 106 may correspond to an energy required to implant the peak concentration of the dopant ions for the pinning layer at some distance between 0 and −D1 as indicated on FIG. 1.

Gate electrode 108 may be formed over some or all of region B of dielectric overlayer 106. FIG. 1 illustrates gate electrode 108 being formed over region C in the substrate 100, the region of the area of buried channel implant 102 and the gap of distance g1 that separates buried channel implant region 102 and photodiode region 104. Gate electrode 108 may be polysilicon, or any other appropriate conductive material. In certain embodiments where the image sensor of FIG. 1 is a CMOS image sensor, it may not be necessary to form a conductive gate electrode 108 above the region 102 (which may serve as a floating diffusion region 102 in the CMOS image sensor), and gate electrode 108 may be omitted. However, in other embodiments where the image sensor of FIG. 1 is a CMOS image sensor, a conductive electrode 108 may be formed above region 102, which may serve as a storage capacitor region 102 in such embodiments. A voltage bias may be applied to gate electrode 108 via terminal 110 that is connected to readout and control circuitry (not illustrated). Voltage signals produced on terminal 110 may control the integration period and readout of photodiode region 104 during operation of an image sensor.

Substrate 100 may be a p-type semiconductor, or an n-type semiconductor substrate. If substrate 100 is an n-type substrate, the portion of substrate 100 visible in FIG. 1, namely the portion of substrate 100 adjacent to and surrounding photodiode region 104 and buried channel implant region 102 in FIG. 1 may be a p-type well formed in the n-type. Photodiode region 104 may extend to a depth D2 in substrate 100 with respect to an upper surface of substrate 100 (i.e., the interface of substrate 100 and dielectric overlayer 106). Above photodiode region 104, or between photodiode region 104 and dielectric overlayer 106, a pinning layer 105 may be formed that extends to a depth D8 in substrate 100 relative to the interface of substrate 100 and dielectric overlayer 106. Generally, the depth D8 of pinning layer 105 within the substrate may be shallower than the depth D2 of photodiode region 104. In other words, D8 may be less than D2. Depth D7 may indicate the depth of the extension of photodiode region 104 into the substrate relative to the interface of pinning layer 105 and photodiode region 104. Generally, the depth D8 of pinning layer 105 may be shallower than the depth D7 of photodiode region 104. Buried channel implant region 102 may extend to a depth D3 with respect to an upper surface of substrate 100 (i.e., the interface of substrate 100 and dielectric overlayer 106). D2 may be greater than, equal to, or less than D3.

Notably, lateral diffusion of charges in the pinning layers may cause charge to leak over into regions adjacent to the photodiode. Whenever light of sufficient energy is incident on silicon, electron-hole pairs are generated. Because electrons generate the signals in a device that utilizes n-type photodiode regions, electrons in the neutral portion of the p-type pinning layer can leak over into regions such as CCD region 102 through p-type isolation regions (not indicated in the figure), which is undesirable, as these charges may be interpreted as image signals and cause a phenomenon known as smear to be manifest in the image produced by CCD pixels. Therefore, it is advantageous to form a thin pinning layer 105 in substrate 100 to reduce the opportunities for electron-hole pairs to be generated, thereby decreasing the amount of smear visible in images produced by the CCD.

Figure 2:
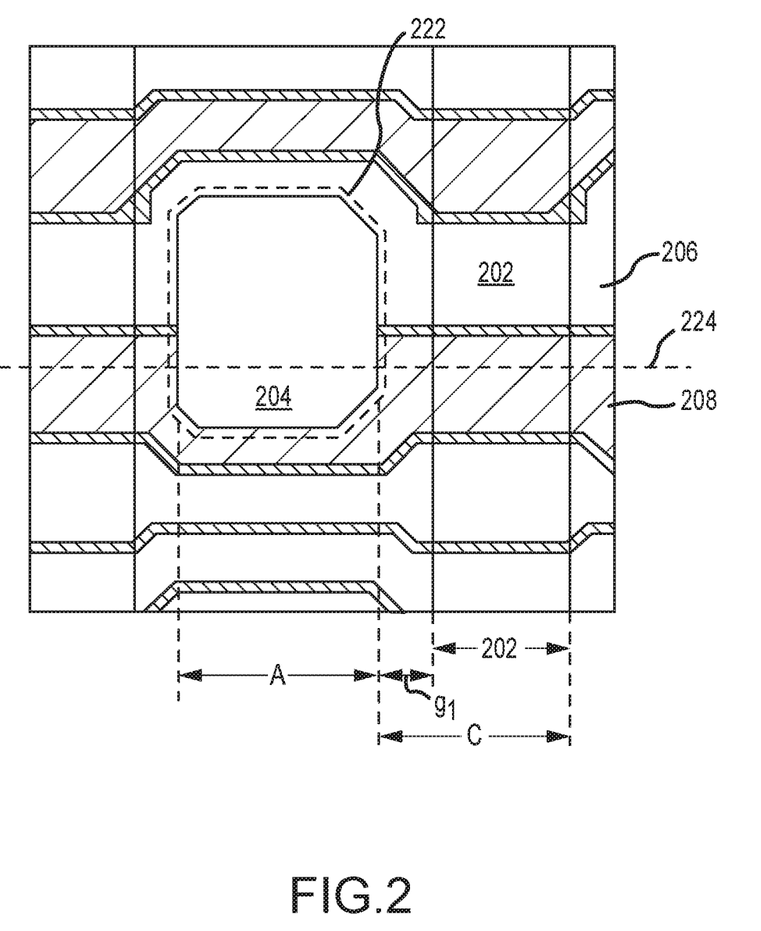
FIG. 2 is a top view of an illustrative image sensor having a pinning layer formed over a photodiode in accordance with an embodiment.

FIG. 2 illustrates a top-down view of the image sensor with a photodiode and pinning layer formed in accordance with an embodiment. FIG. 1 may illustrate a cross sectional view along axis 224 of FIG. 2. Dielectric overlayer 206 may be formed over an upper surface of a semiconductor substrate such as substrate 100 of FIG. 1. Photodiode region 204 may be a region in the semiconductor substrate below dielectric overlayer 206. Gate electrode 108 may be formed over at least region C of dielectric overlayer 206. Gate electrode 108 may be formed above a region of the substrate that at least partially surrounds photodiode region 204. A buried channel implant region such as region 102 of FIG. 1 may be formed in region 202 in the substrate underneath gate electrode 208 at a distance g1 from photodiode region 204. The region underneath gate electrode 208 in the region of the semiconductor substrate with width g1 between photodiode region 204 and buried channel implant region 202 may be referred to as the transfer gate region.

Region 222 corresponds to region A of overlayer 206 below which, as described above in connection with FIG. 1, a pinning layer (such as pinning layer 105 of FIG. 1) for photodiode region 204 may be formed. Region 222 may indicate the area in the substrate above photodiode region 204, or between photodiode region 204 and overlayer 206, in which a pinning layer such as pinning layer 105 of FIG. 1 may be formed. As shown in FIG. 2, it may be desirable for region 222 in which a pinning layer for photodiode region 204 is formed to extend at least as far as the area of photodiode region 204. Region 222, in which a pinning layer is formed, may be typically coupled to a ground potential or a ground voltage.

Figure 3:
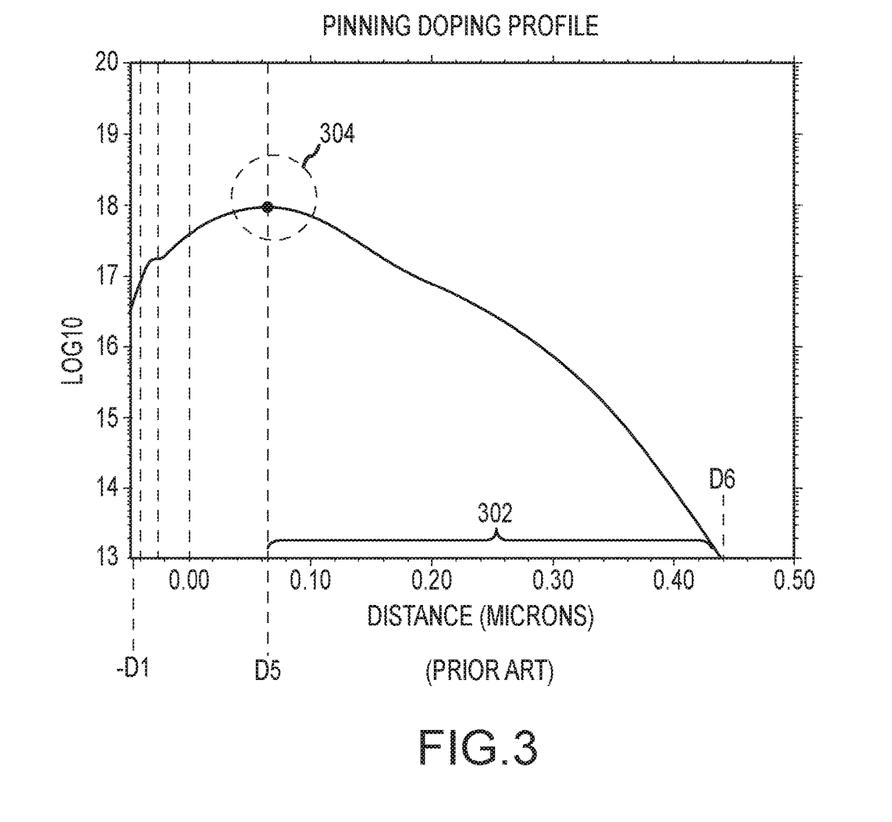
FIG. 3 is a doping profile of a conventional pinning layer implanted in a semiconductor substrate with a maximum concentration within the substrate.

FIG. 3 illustrates a conventional impurity ion doping profile that is used to form a pinning layer for photodiodes in a conventional image sensor. The horizontal axis of FIG. 3 may correspond to a doping profile in a vertical cross section of a conventional image sensor. The doping profile of FIG. 3 corresponds to the p-type dopant that is implanted through an overlayer of a conventional image sensor to form a pinning layer for a photodiode region. Conventional doping profiles for a pinning layer correspond to Boron implants, for example, for p-type pinning layers.

The zero (0) marking on the horizontal axis corresponds to the interface between a substrate and dielectric overlayer in a conventional image sensor. In FIG. 3, positive values on the horizontal axis (to the right of 0) correspond to positions in the substrate of a conventional image sensor, and negative values on the horizontal axis (to the left of 0) correspond to positions in the dielectric overlayer formed over the substrate of the conventional image sensor. Peak region 304 of the p-type dopant profile of the pinning layer is located at a positive value on the horizontal axis, corresponding to a position in the substrate of a conventional image sensor.

While the concentration of dopant ions in the negative portion of the horizontal axis (corresponding to positions in a dielectric overlayer formed over the substrate of a conventional image sensor) is non-zero, the doping concentration profile has a maximum value in the positive portion of the horizontal axis (corresponding to positions in the substrate of a conventional image sensor). Specifically, the doping concentration profile has a maximum value at a location D5 in the substrate of a conventional image sensor that corresponds to a depth in the substrate that is less than the depth of the photodiode region in the conventional image sensor.

The doping concentration profile of FIG. 3, corresponding to a conventional dopant profile for the pinning layer has a tail region 302 corresponding to the region where the concentration of dopants decreases at a near-constant rate. In this prior-art example, the dopant concentration shown in tail region 302 of FIG. 3 decreases from a peak concentration of 1E18 atoms per cubic centimeter to 1E13 in a distance of approximately 360 nanometers, or using the logarithmic values, from a peak log of the concentration of 18 to a log of the concentration 13 in a distance of approximately 360 nanometers. The rate of decrease in the log of impurity for tail region 302 is therefore approximately $5/360$ nm, or 13.8 per micron.

Figure 4:
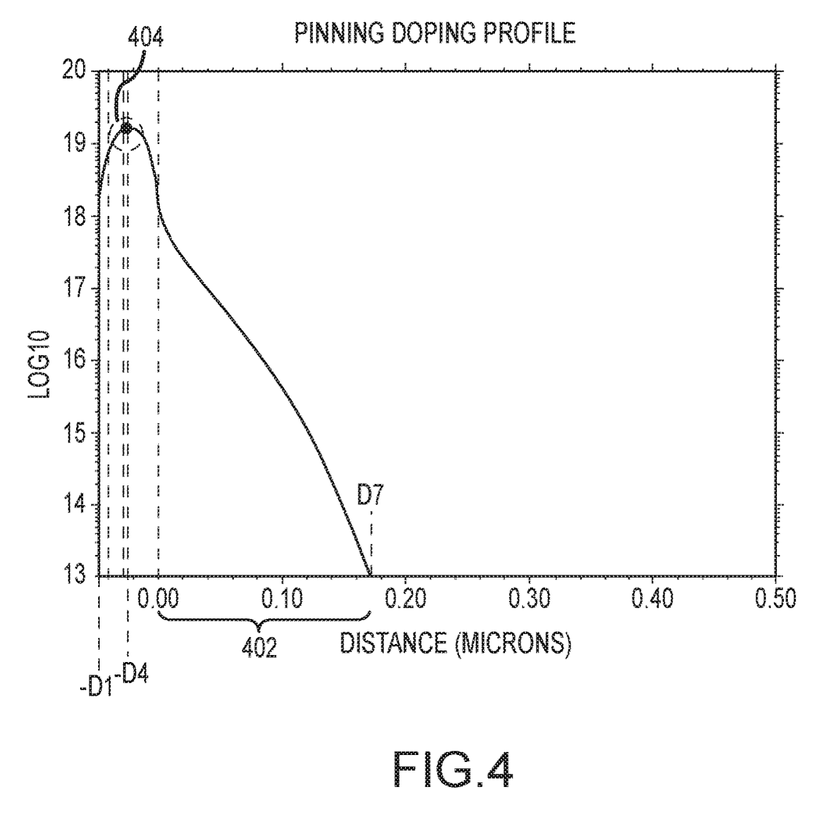
FIG. 4 is an illustrative doping profile of a pinning layer formed over a photodiode with a maximum concentration within a dielectric overlayer in accordance with an embodiment.

FIG. 4 illustrates an impurity ion doping profile that is used to form a pinning layer for photodiodes such as photodiode regions 104 or 204 in accordance with an embodiment. The horizontal axis of FIG. 4 may correspond to the axis 112 of FIG. 1. The doping profile of FIG. 4 may correspond to the p-type dopant that is implanted into and through an overlayer such as 106 formed above substrate 100 of FIG. 1 to form a pinning layer 105 in the substrate for photodiode region 104. The doping profile for the pinning layer of FIG. 4 may correspond to a doping profile from a $BF_2$ implant for p-type pinning layers. Alternatively, the doping profile for the pinning layer of FIG. 4 may correspond to a doping profile from a low-energy boron implant, or any other p-type impurity dopant profile.

The zero (0) marking on the horizontal axis of FIG. 4 may correspond to the interface between substrate 100 and dielectric overlayer 106. In FIG. 4, positive values on the horizontal axis (to the right of 0) may correspond to positions in substrate 100, and negative values on the horizontal axis (to the left of 0) may correspond to positions in dielectric overlayer 106. Peak region 404 of the p-type dopant profile of the pinning layer is located at a negative value on the horizontal axis, corresponding to a position in dielectric overlayer 106. The doping concentration profile has a maximum value in the negative portion of the horizontal axis (corresponding to positions in overlayer 106) due to the energy used to implant the dopants to form the pinning layer. Specifically, the doping concentration profile has a maximum value at a location −D4 in overlayer 106 that may correspond to a height above substrate 100 in overlayer 106. A low-energy implant may be used to intentionally implant dopant ions in a manner such that a maximum concentration of the doping profile of FIG. 4 is implanted in the dielectric overlayer 106, with only the tail portion 402 of the doping profile within the semiconductor substrate 100.

The doping concentration profile of FIG. 4 of a dopant profile for the pinning layer has a tail region 402 corresponding to the region where the concentration of dopants decreases. This tail portion 402 of the doping profile that extends into the semiconductor substrate 100 may correspond to pinning layer 105 of FIG. 1. Tail region 402 may be characterized by a region where the rate of decrease of the dopant concentration is at approximately an exponential rate. In this example, the dopant concentration shown in tail region 402 of FIG. 4 decreases from an initial concentration of 1E18 atoms per cubic centimeter to 1E13 in a distance of approximately 180 nanometers, or using the logarithmic values, from a peak log of the concentration of 18 to a log of the concentration 13 in a distance of approximately 180 nanometers. The rate of decrease in the log of impurity for tail region 402 is therefore approximately $5/180$ nm, or 27.6 per micron.

Notably, the depth at D7 in FIG. 4 is less than half the depth of D6 in FIG. 3 of the prior art, therefore making for a much shallower p-type pinning layer within the semiconductor. This shallower pinning layer allows for a shallower n-type photodiode implant, and hence, a higher photodiode capacitance. The higher photodiode capacitance allows for a given saturation charge to be collected with a smaller voltage swing. In other words, a given saturation charge can be collected with a smaller empty diode potential, or pinned potential.

FIG. 5 illustrates the voltage potentials in regions of the semiconductor substrate 100 of FIG. 1. Specifically, region 534 may correspond to the photodiode region 104 of FIG. 1, the region of width g1 may correspond to the portion of substrate 100 between photodiode region 104 and buried channel implant region 102, and region 532 may correspond to buried channel implant region 502.

Figure 5A:
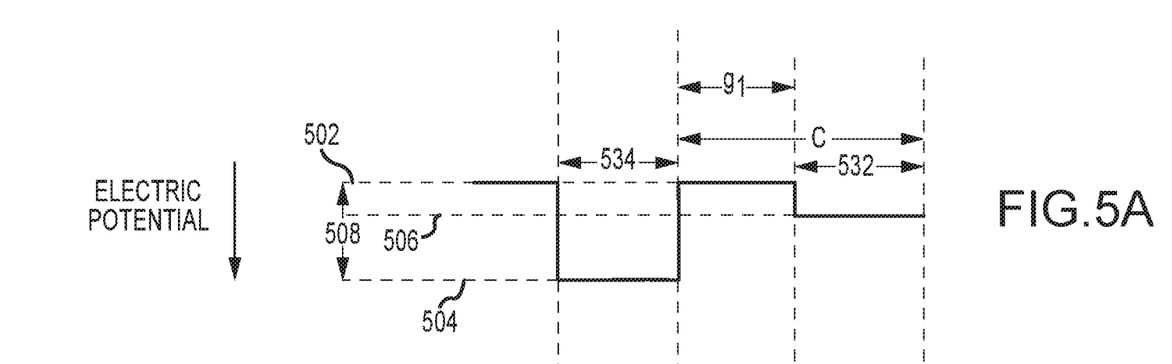
FIGS. 5A-5B are illustrative potential diagrams of an image sensor with a pinning layer over a photodiode in accordance with an embodiment.

FIG. 5A illustrates the voltage potentials in regions of substrate 100 when the voltage at terminal 110 is in the off state. In region 534, a first voltage difference 508 may correspond to the potential of empty photodiode region 104. The presence of a pinning layer 105 above photodiode region 104 under overlayer 106 ensures that the voltage difference 508 does not vary based on the voltage applied to terminal 110, and consequently gate electrode 108. Potential 502 may correspond to the potential of substrate 100 that is typically set to ground.

Potential 506 may correspond to a potential higher than potential 502, in the buried channel implant region 532. Buried channel implant region 532 may be a light n-type doped region (n− region). Potential 504 may correspond to a potential higher or lower than potential 506 in the photodiode region 534, depending on exact process details and the potential on gate electrode 108. Photodiode region 534 may be a heavier n-type doped region (n+ region). Alternatively, potential 504 may be equal to or less than potential 506.

Potential difference 508 indicates the difference in the potential of photodiode region 534 and the potential in the gap between regions 534 and 532 of width g1. The high potential difference between the two regions prevents charge generated and collected in region 534 from transferring through the transfer region spanning g1 between regions 534 and 532 into region 532 during the image integration time period.

Figure 5B:
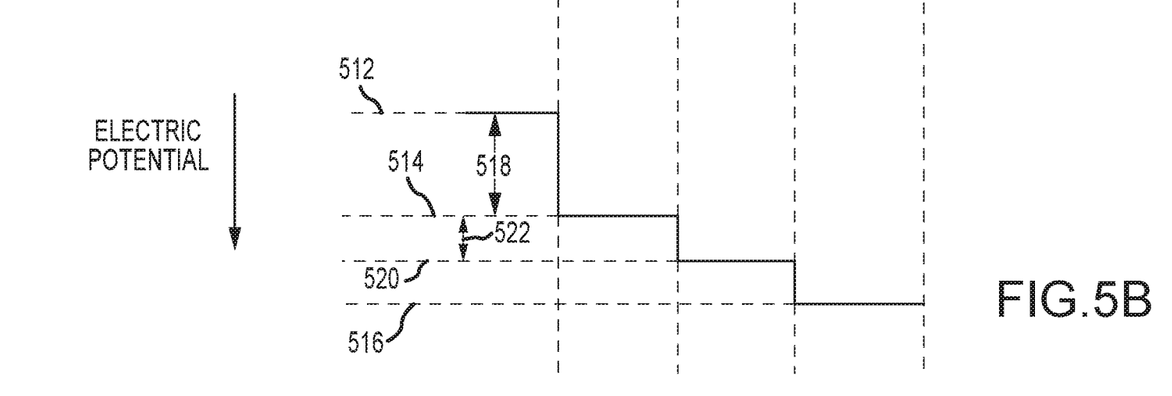

FIG. 5B illustrates the voltage potentials in regions of substrate 100 when a more positive voltage is applied at terminal 110, relative to the off state of FIG. 5A. When it is desired to completely read out, or transfer charge generated and collected in region 534 by light incident on photodiode 104 into buried channel implant region or CCD 102 a positive voltage may be applied to terminal 110, and consequently applied to gate electrode 108 which is formed over region C of substrate 100. The magnitude of the positive voltage applied to terminal 110 required to enable a complete transfer of charges generated in photodiode region 534 to CCD region 532 may be reduced by forming a shallower pinning and photodiode layers to increase the capacitance of the photodiode.

For a given target capacity of the photodiode region 534 or 104, providing a shallower pinning and photodiode layer may reduce the empty diode potential, and hence, the potential required on gate electrode 108 to completely readout charges stored in photodiode region 104. The lower empty diode potential also results in a lower potential on the substrate being required to enable electronic shuttering action, wherein charge stored in the photodiode is emptied to the substrate in a typical interline CCD image sensor with a VOD (vertical overflow drain) structure.

Voltage difference 522 may correspond to the potential difference between the photodiode region 534 and the portion of substrate 100 between regions 532 and 534. The potential between regions 532 and 534 with of a width g1 may correspond to potential 520. Potential 516 may correspond to the voltage in the buried channel implant region 532. Because the pinning layer 105 formed over photodiode region 104 ensures that voltage difference 518 (when a positive gate voltage is applied above region C) is essentially the same as voltage difference 508 (when a ground voltage or no voltage is applied above region C), the voltage required to be applied above region C to ensure a sufficiently large voltage difference 522 may be reduced. Because potential 520 is at a greater potential than potential 514 when a positive voltage is applied over region C, a complete readout of the generated electrons in the n-type photodiode region 104 or 534 is possible.

When the positive voltage is applied above region C, buried channel implant region 532 may be at a higher potential 516 compared to potential 520. Therefore, charges generated in photodiode region 104 or 534 may be may be completely read out into the region of semiconductor substrate between regions 534/104 and 532/102 and then into buried channel implant region 532/102.

FIG. 6 illustrates a method for forming a shallow pinning layer above a photodiode region of an image sensor. Substrate 600 in FIG. 6 may be equivalent to substrate 100 of FIG. 1. The visible region of substrate 600 may correspond to a p-type well formed in an n-type semiconductor wafer. Substrate 600 may alternatively be a p-type semiconductor. Dielectric overlayer 606 may be equivalent to dielectric overlayer 106 of FIG. 1. Dielectric overlayer 606 may include a layer of oxide, a nitride layer with oxide formed over the nitride layer, or an ONO layer. In general, dielectric overlayer 606 may include multiple dielectric layers each with a corresponding dielectric constant. Dielectric overlayer 606 may be formed on an upper surface of substrate 600.

Figure 6A:
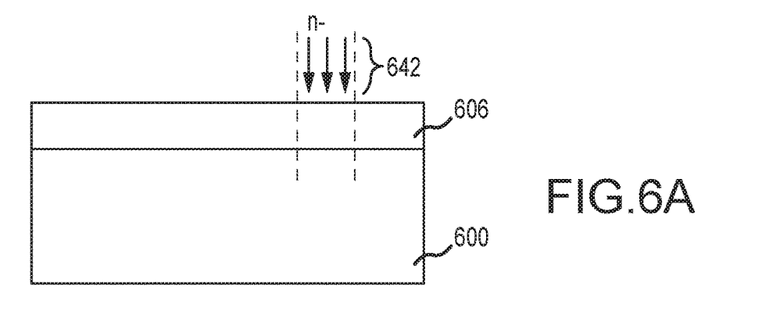
FIGS. 6A-6D are cross-sectional views of an illustrative image sensor corresponding to steps involved in forming a pinning layer over a photodiode in accordance with an embodiment.

FIG. 6A illustrates ion implantation of n-type dopants 642. N-type dopants 642 may be implanted through dielectric overlayer 606 into substrate 600. N-type dopants 642 may be implanted with an energy that results in a maximum dopant ion concentration of N-type dopants 642 at a position within substrate 600.

Figure 6B:
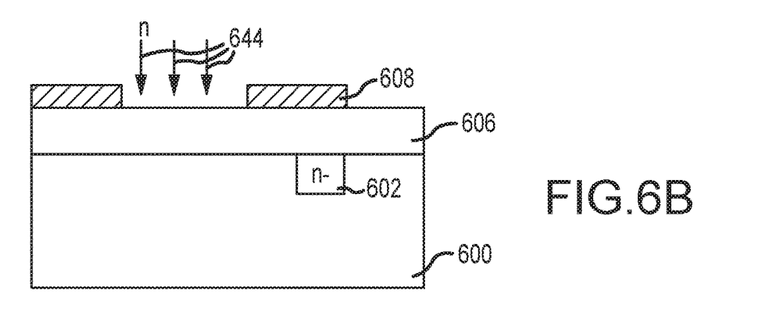

FIG. 6B illustrates the buried channel implant region 602 formed by n-type dopants 642 implanted into substrate 600 through dielectric overlayer 606 in FIG. 6A. Buried channel implant region 602 may be a lightly doped region of substrate 600 (i.e., an n− region of substrate 600). After implanting n-type dopants 642 in substrate 600 through dielectric overlayer 606, conductive material 608 may be formed over regions of dielectric overlayer 606. Specifically, conductive material 608 may be formed over at least the area of buried channel implant region 602. Conductive material 608 may be used to define a region where n-type dopants 644 are implanted. In other words, conductive material 608 may be formed around an area under which it is desired to form a photodiode region.

After forming conductive material 608 over regions of overlayer 606, N-type dopants 644 may be implanted with an energy that results in a maximum dopant ion concentration of N-type dopants 644 at a position within substrate 600. N-type dopants 644 may be implanted in regions of overlayer 606 over which conductive material 608 is not formed.

Figure 6C:
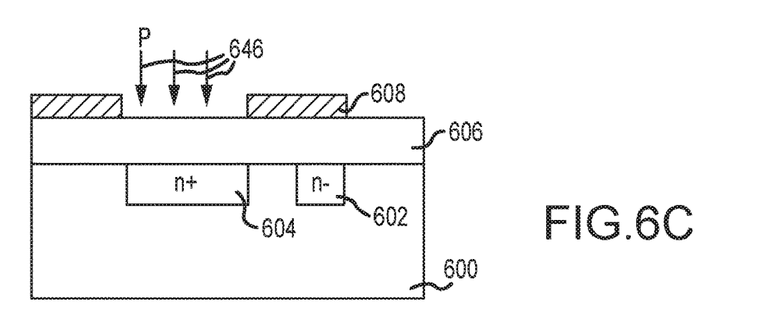

FIG. 6C illustrates photodiode region 604 formed by n-type dopants 644 implanted into substrate 600 through dielectric overlayer 606 in FIG. 6B. Photodiode region 604 may be a heavily doped region of substrate 600 (i.e., an n+ region of substrate 600). After implanting N-type dopants 644 to form photodiode region 604, P-type dopants 646 may be implanted to form a pinning layer over photodiode region 604 in a region of substrate 600 below overlayer 606. The pinning layer formed by p-type dopants 646 may be interposed between photodiode region 604 and overlayer 606. P-type dopants 646 may be implanted with an energy that results in a maximum dopant ion concentration of P-type dopants 646 at a position within overlayer 606, as described in connection with FIG. 4. P-type dopants 646 may be implanted in and through regions of overlayer 606 over which conductive material 608 is not formed (i.e., the same regions of overlayer 606 through which N-type dopants 644 were implanted to form photodiode region 604).

Figure 6D:
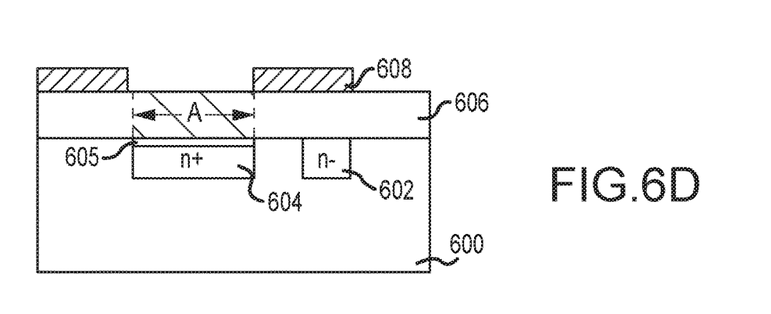

FIG. 6D shows a region A of overlayer 606 below which a pinning layer 605 has been formed in substrate 600 by P-type dopants 646. Region A may be equivalent to region A of FIG. 1. Region A may have an area at least as large as the area of photodiode region 604 at the interface of overlayer 606 and substrate 600. Region A may have a maximum value of dopant 646 concentration implanted in FIG. 6C. The dopant 646 concentration in region A of overlayer 606 may correspond to the dopant concentration shown in FIG. 4 between −D1 and 0. The dopant 646 concentration in pinning layer 605 may correspond to the dopant concentration shown in FIG. 4 between 0 and D7. As would be known to those skilled in the art, the pinning implant dose must be sufficient so that there is at least a portion of the implant profile tail near the interface of dielectric overlayer 606 and substrate 600 that is not fully depleted of majority carriers, so as to form a pinned photodiode. The pinning layer 605 formed in the semiconductor substrate above the photodiode 604 and spanning an area in substrate 600 below region A of overlayer 606 may be coupled to a ground voltage or any other voltage during operation and readout of photodiode region 604.

FIG. 7 illustrates another method for forming a shallow pinning layer in a dielectric overlayer above a photodiode region of an image sensor. Substrate 700 in FIG. 7 may be equivalent to substrate 100 of FIG. 1. The visible region of substrate 700 may correspond to a p-type well formed in an n-type semiconductor wafer. Substrate 700 may alternatively be a p-type semiconductor. Dielectric overlayer 706 may be equivalent to dielectric overlayer 106 of FIG. 1. Dielectric overlayer 706 may include a layer of oxide, a nitride layer with oxide formed over the nitride layer, or an ONO layer. In general, dielectric overlayer 706 may include multiple dielectric layers each with a corresponding dielectric constant. Dielectric overlayer 706 may be formed on an upper surface of substrate 700.

Figure 7A:
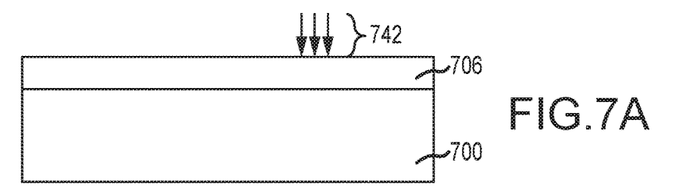
FIGS. 7A-7F are cross-sectional views of an illustrative image sensor corresponding to steps involved in forming a pinning layer over a photodiode after etching away portions of a dielectric overlayer in accordance with an embodiment.

FIG. 7A illustrates ion implantation of n-type dopants 742. N-type dopants 742 may be implanted through dielectric overlayer 706 into substrate 700. N-type dopants 742 may be implanted with an energy that results in a maximum dopant ion concentration of N-type dopants 742 at a position within substrate 700.

Figure 7B:
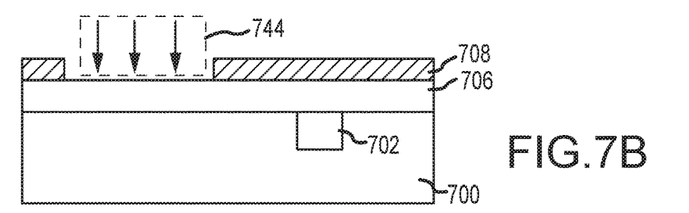

FIG. 7B illustrates the buried channel implant region 702 formed by n-type dopants 742 implanted into substrate 700 through dielectric overlayer 706 in FIG. 6A. Buried channel implant region 702 may be a lightly doped region of substrate 700 (i.e., an n− region of substrate 600). After implanting n-type dopants 642 in substrate 600 through dielectric overlayer 606, conductive material 708 may be formed over regions of dielectric overlayer 706. Specifically, conductive material 708 may be formed over at least the area of buried channel implant region 702. Conductive material 708 may be used to define a region where n-type dopants 744 are implanted. In other words, conductive material 708 may be formed around an area under which it is desired to form a photodiode region.

After forming conductive material 708 over regions of overlayer 706, N-type dopants 744 may optionally be implanted with an energy that results in a maximum dopant ion concentration of N-type dopants 744 at a position within substrate 700. N-type dopants 744 may be implanted into substrate 700 through regions of overlayer 706 over which conductive material 708 is not formed. Alternatively, N-type dopants 744 may not be implanted at this stage.

Figure 7C:
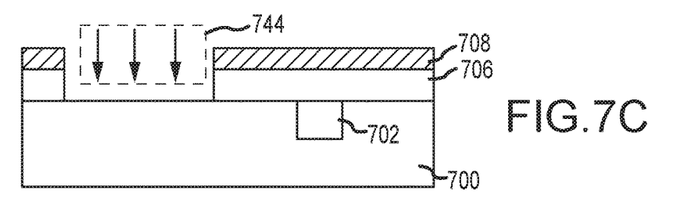

FIG. 7C illustrates etching, wet-etching, or wet-chemical etching away a portion of overlayer 706. Etching away a portion of overlayer 706 results in a portion of overlayer 706 being removed. The portion of overlayer 706 that is removed may correspond to the portion of overlayer 706 over which conductive material 708 is not formed. The portion of overlayer 706 that is removed may correspond to the portion of overlayer 706 that is above the region of substrate 700 in which it is desired to form a photodiode region, or over which a photodiode region is already formed.

After etching away a region of overlayer 706, N-type dopants 744 may optionally be implanted with an energy that results in a maximum dopant ion concentration of N-type dopants 744 at a position within substrate 700. N-type dopants 744 may be implanted into substrate 700 through regions of overlayer 706 over which conductive material 708 is not formed. If N-type dopants 744 were implanted in a previous stage of processing, they may not be implanted at this stage.

Figure 7D:
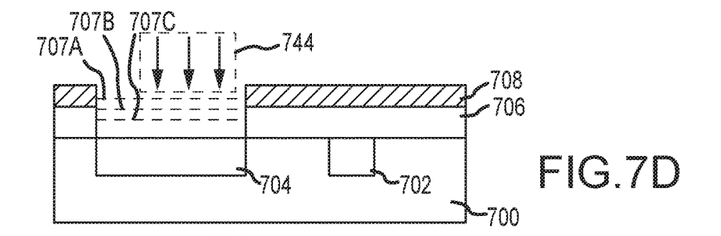

FIG. 7D illustrates forming transparent dielectric layers 707 in the region of overlayer 706 that was etched away in FIG. 7C. FIG. 7D illustrates photodiode region 704 formed by n-type dopants 744 implanted into substrate 700 through dielectric overlayer 706 in FIG. 7B or 7C. Photodiode region 704 may be a heavily doped region of substrate 600 (i.e., an n+ region of substrate 600). A multiple of transparent dielectric layers 707 may be formed, each with respective refractive indices, dielectric constants, and optical transmission properties that may enhance or tune the light incident on layers 707 and that reaches photodiode region 704. Layers 707 may be chosen to provide filtering effects, create interference, or create resonance in selected wavelengths of light incident on layers 707. The height of layers 707 above the surface of substrate 700 may be the same as, greater than, or less than the height of overlayer 706 above the surface of substrate 700. In some embodiments, N-type dopants 744 are implanted after layers 707 are formed. In general, layers 707 may have a different height or thickness than the height or thickness of dielectric overlayer 706. Similarly, layers 707 may have different optical transmission properties than the optical transmission properties of dielectric overlayer 706.

Figure 7E:
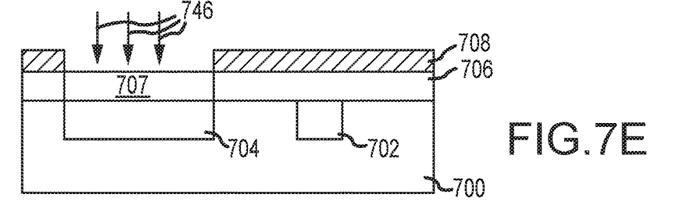

FIG. 7E illustrates implanting P-type dopants 746. After implanting N-type dopants 744 to form photodiode region 704, P-type dopants 746 may be implanted to form a pinning layer over photodiode region 704 in a region of substrate 700 below layers 707. The pinning layer formed by p-type dopants 746 may be interposed between photodiode region 704 and layers 707. P-type dopants 746 may be implanted with an energy that results in a maximum dopant ion concentration of P-type dopants 746 at a position within layers 706, similar to the manner described in connection with FIG. 4. The zero (0) position of FIG. 4 may correspond to the interface of layer 707A and substrate 700, while the −D1 position may correspond to the height of layer 707C above the upper surface of substrate 700. P-type dopants 746 may be implanted in and through layers 707 over which conductive material 708 is not formed.

Figure 7F:
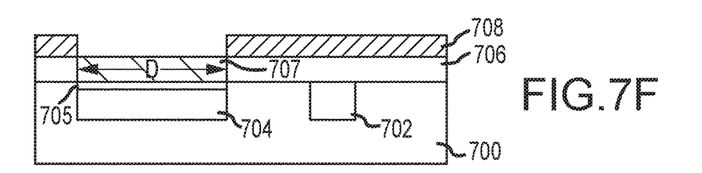

FIG. 7F shows a region D of layer 707 below which a pinning layer 705 has been formed in substrate 600 by P-type dopants 746. Region D may have an area at least as large as the area of photodiode region 704 at the interface of layers 707 and substrate 700. Region D may have a maximum value of dopant 746 concentration implanted in FIG. 7E. The dopant 746 concentration in region D of layers 707 may correspond to the dopant concentration shown in FIG. 4 between −D1 and 0. The dopant 746 concentration in pinning layer 705 may correspond to the dopant concentration shown in FIG. 4 between 0 and D7. As would be known to those skilled in the art, the pinning implant dose must be sufficient so that there is at least a portion of the implant profile tail near the interface of dielectric overlayer 706 and substrate 600 that is not fully depleted of majority carriers, so as to form a pinned photodiode. The pinning layer formed in the semiconductor substrate above the photodiode layer 704 spanning an area in substrate 700 below region D of layers 707 may be coupled to a ground voltage or any other voltage during operation and readout of photodiode region 704.

Various embodiments have been described illustrating image sensors with photodiodes formed in a substrate. Photodiodes may be formed in the substrate by implanting dopants of a first type into a photodiode region of the substrate through a dielectric layer. The dielectric layer over a photodiode may be formed over an upper surface of the substrate. A pinning layer may be formed over the photodiodes in the substrate. The pinning layer for a photodiode may be formed over at least the area in the substrate in which the photodiode is formed. The pinning layer for a photodiode may be formed in the substrate and be interposed between the photodiode and the dielectric layer above the photodiode. The photodiode may extend to a depth in the substrate relative to the interface of the pinning layer and the photodiode that is greater than the depth of the pinning layer relative to the interface of the substrate and the dielectric layer formed over the photodiode.

Dopants of a second type may be implanted into and through the dielectric layer over the photodiode to form the pinning layer in the semiconductor substrate. Boron or boron difluoride ($BF_2$) ions may be implanted into and through the dielectric layer that is formed over the photodiode to form the pinning layer in the substrate. The concentration of dopants of the second type have a maximum concentration within the pinning layer in the dielectric layer over the photodiode. Any concentration of dopants of the second type in the substrate are lower than the concentration of dopants of the second type in the pinning implant profile in the dielectric layer over the photodiode. During operation of the image sensor, the pinning layer in the semiconductor substrate over the photodiode may be biased or coupled to a ground voltage supply.

A conductive structure may be formed on a dielectric overlayer that is formed over the substrate. The photodiode may be formed by implanting ions through portions of the dielectric overlayer that are uncovered by the conductive structure. The conductive structure may be a gate electrode structure. The pinning layer formed over the photodiode may be formed in the portions of the dielectric overlayer over the photodiode that are uncovered by the conductive structure. In certain embodiments where the image sensor is a CMOS image sensor, the conductive structure may be omitted. However, other embodiments where the image sensor is a CMOS image sensor may include the conductive structure.

Portions of the dielectric overlayer that are uncovered by the conductive structure may be etched away. One or more additional dielectric layers may be formed over the substrate exposed by the etching away of portions of the dielectric overlayer uncovered by the conductive structure. The additional dielectric layers may be chosen to provide optical filtering effects, create interference, or create resonance in selected wavelengths of light incident on the additional dielectric layers.

The additional dielectric layers may be formed adjacent to portions of the dielectric overlayer that are covered by the conductive structure. Portions of the dielectric overlayer that are covered by the conductive layer may have a first thickness. The thickness of the additional dielectric layers may be greater than, the same as, or less than the first thickness.

Photodiodes may be formed in the substrate by implanting dopants of the first type through the additional dielectric layers. The pinning layer over a photodiode may be formed in the substrate by implanting ions of the second type.

The concentration of dopants of the second type may have a maximum concentration within the pinning layer in the additional dielectric layers over the photodiode. Any concentration of dopants of the second type in the substrate are lower than the concentration of dopants of the second type in the pinning implant profile formed in the additional dielectric layers over the photodiode. During operation of the image sensor, the pinning layer in the semiconductor substrate over the photodiode may be biased or coupled to a ground voltage supply.

The foregoing embodiments may be applied to CMOS image sensors or CCD image sensors. In certain CMOS image sensors, it may not be necessary to form a conductive gate electrode 108 over portions of the semiconductor substrate adjacent to the photodiode.

The foregoing is merely illustrative of the principles of this invention and various modifications can be made by those skilled in the art without departing from the scope and spirit of the invention. The foregoing embodiments may be implemented individually or in any combination.

What is claimed is:

1. A method comprising:
   forming a dielectric layer over an upper surface of a substrate;
   implanting dopants of a first type into a channel implant region of the substrate through the dielectric layer;
   forming a conductive structure over only a portion of the dielectric layer;
   etching away exposed portions of the dielectric layer, wherein the exposed portions of the dielectric layer are formed above photodiode regions of the substrate;
   after etching away the exposed portions of the dielectric layer, forming additional dielectric layers over the photodiode regions of the substrate; and
   after etching away the exposed portions of the dielectric layer, implanting dopants of the first type into the photodiode regions of the substrate.

2. The method defined in claim 1, wherein the exposed portions of the dielectric layer are not covered by the conductive structure.

3. The method defined in claim 1, wherein implanting dopants of the first type into the photodiode regions of the substrate comprises implanting dopants of the first type into the photodiode regions of the substrate through the additional dielectric layers.

4. The method defined in claim 3, wherein implanting dopants of the first type into the photodiode regions comprises:

implanting a maximum concentration of the first type of dopants within the photodiode region of the substrate.

5. The method defined in claim 1, further comprising:
implanting dopants of a second type into a pinning region of the substrate, wherein the pinning region is formed above the photodiode region of the substrate.

6. The method defined in claim 5, wherein implanting dopants of the second type comprises:
implanting a maximum concentration of the second type of dopants within the additional dielectric layers.

7. A method comprising:
forming a dielectric layer over an upper surface of a substrate;
implanting dopants of a first type into a channel implant region of the substrate through the dielectric layer;
forming a conductive structure over only a portion of the dielectric layer;
etching away exposed portions of the dielectric layer, wherein the exposed portions of the dielectric layer are formed above photodiode regions of the substrate;
implanting dopants of the first type directly into the photodiode regions of the substrate after etching away the exposed portions of the dielectric layer; and
forming additional dielectric layers over the photodiode regions of the substrate.

8. A method comprising:
forming a dielectric layer over an upper surface of a substrate;
forming a conductive structure over the dielectric layer, wherein the conductive structure has an opening;
implanting dopants of a first type through the opening in the conductive structure into the substrate to form a photodiode;
etching away portions of the dielectric layer that are exposed through the opening in the conductive structure;
forming at least one additional dielectric layer over the substrate; and
implanting dopants of a second type into a pinning region, wherein the pinning region has a concentration of the dopants of the second type greater than 1E18 atoms per cubic centimeter in the at least one additional dielectric layer and a concentration of the dopants of the second type less than 1E18 atoms per cubic centimeter in the substrate.

9. The method defined in claim 8, wherein the doping profile of the pinning region has a maximum concentration of the dopants of the second type implanted within the at least one additional dielectric layer.

10. The method defined in claim 8, further comprising:
before forming the conductive structure over the dielectric layer, implanting dopants of the first type into a channel implant region of the substrate through the dielectric layer.

* * * * *